United States Patent
Waite et al.

(10) Patent No.: US 11,424,164 B2
(45) Date of Patent: Aug. 23, 2022

(54) ENHANCED ETCH RESISTANCE FOR INSULATOR LAYERS IMPLANTED WITH LOW ENERGY IONS

(71) Applicant: Applied Materials, Inc., Santa Clara, CA (US)

(72) Inventors: Andrew Michael Waite, Beverly, MA (US); Johannes M. van Meer, Middleton, MA (US); Jae Young Lee, Bedford, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/006,428

(22) Filed: Aug. 28, 2020

(65) Prior Publication Data

US 2022/0068715 A1    Mar. 3, 2022

(51) Int. Cl.
*H01L 21/8234* (2006.01)
*H01L 21/26* (2006.01)

(52) U.S. Cl.
CPC ...... *H01L 21/823418* (2013.01); *H01L 21/26* (2013.01); *H01L 21/823431* (2013.01)

(58) Field of Classification Search
CPC ............... H01L 21/823418; H01L 21/823431
See application file for complete search history.

(56) References Cited

U.S. PATENT DOCUMENTS

| 6,013,566 | A  | * | 1/2000 | Thakur | H01L 21/2233 |
|           |    |   |        |        | 438/513 |
| 9,023,705 | B1 | * | 5/2015 | Paul   | H01L 27/0886 |
|           |    |   |        |        | 438/283 |
| 2013/0161729 | A1 | * | 6/2013 | Xie | H01L 29/0653 |
|           |    |   |        |        | 257/329 |

* cited by examiner

*Primary Examiner* — Dale E Page
*Assistant Examiner* — Quovaunda Jefferson
(74) *Attorney, Agent, or Firm* — KDB Firm PLLC

(57) ABSTRACT

In one embodiment, a method may include providing a substrate, comprising a plurality of surface features, an isolation layer, disposed between the plurality of surface features, and a substrate base, disposed subjacent the isolation layer and the plurality of surface features, wherein the plurality of surface features extend above a surface of the isolation layer. The method may include directing a low energy ion beam to the substrate, when the substrate is heated at a targeted temperature, wherein an altered layer is formed within an outer portion of the isolation layer, and wherein an inner portion of the isolation layer is not implanted.

19 Claims, 6 Drawing Sheets

ENHANCED ETCH RESISTANCE FOR INSULATOR LAYERS IMPLANTED WITH LOW ENERGY IONS

FIELD

The present embodiments relate to semiconductor device processing techniques, and more particularly, to generating isolation structures for semiconductor devices.

BACKGROUND

As semiconductor devices scale to smaller dimension, the demand upon device materials may become increasingly stringent. Insulators that provide isolation properties such as isolation oxides are employed at the transistor level to provide device isolation. In recent technology generations, flowable type oxides such as FCVD™ (FCVD is a trademark of Applied Materials Corporation) have found use in gap fill applications, for example. One issue encountered with the use of flowable oxides is the relatively high etch rate, leading to narrow process windows for fabrication of devices where many etch processes may be employed that inadvertently etch the flowable oxides. For example, in finFET devices and related fin-type device such as horizontal gate all around (GAA) devices, flowable oxide may be used as an isolation layer between adjacent fin structures. Device processing to form transistors may lead to undue etching of the flowable oxide, leading to reduced isolation and poor device performance. Efforts to address this issue include high energy Helium implantation into the flowable oxide. This approach has the unwanted collateral effect of introducing damage into adjacent structures, including in semiconductor fins.

With respect to these and other considerations, the present disclosure is provided.

BRIEF SUMMARY

In one embodiment, a method may include providing a substrate, comprising a plurality of surface features, an isolation layer, disposed between the plurality of surface features, and a substrate base, disposed subjacent the isolation layer and the plurality of surface features, wherein the plurality of surface features extend above a surface of the isolation layer. The method may include directing a low energy ion beam to the substrate, when the substrate is heated at a targeted temperature, wherein an altered layer is formed within an outer portion of the isolation layer, and wherein an inner portion of the isolation layer is not implanted.

In another embodiment, a method may providing a substrate, comprising a plurality of semiconductor fins, an isolation layer, comprising a flowable oxide disposed between the plurality of semiconductor fins; and a substrate base, disposed subjacent the isolation layer and the plurality of semiconductor fins. As such the plurality of semiconductor fins may extend above a surface of the isolation layer; and directing a low energy silicon ion beam to the substrate, when the substrate is heated at a targeted temperature, wherein the low energy comprises an ion energy in the range of 100 eV to 500 eV.

In an additional embodiment a method of forming a gate all around (GAA) device, is provided. The method may include providing a substrate, comprising a plurality of semiconductor fins, an isolation layer, disposed between the plurality of semiconductor fins, and a substrate base, disposed subjacent the isolation layer and the plurality of semiconductor fins. As such, the plurality of semiconductor fins may form a Si/SiGe heterostructure and extend above a surface of the isolation layer. The method may include directing a low energy silicon ion beam to the substrate, when the substrate is heated at a temperature in the range of 400° C. to 700° C., wherein the low energy comprises an ion energy in the range of 100 eV to 500 eV.

Figure 1A:
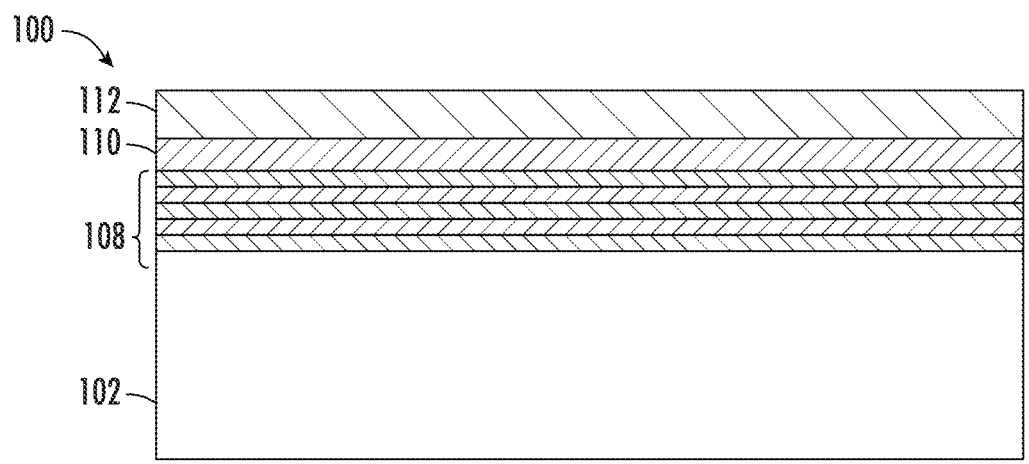
FIGS. 1A-1H depict side cross-sectional views of a substrate during various operations for forming an isolation structure, according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel techniques to form isolation structures in a substrate and in particular in a semiconductor device, such as a finFET. The present embodiments address issues related to the preservation of and the uniformity of isolation oxide, such as shallow trench isolation (STI) oxide, when formed on a substrate having patterned structures, such as fin structures.

FIGS. 1A-1H depict side cross-sectional views of a substrate during various operations for forming an isolation structure, according to embodiments of the disclosure. The example shown involves the preparation of a semiconductor device structure, where the synthesis of the semiconductor device structure may form part of a fabrication sequence for forming a semiconductor device, such as a three-dimensional transistor.

At FIG. 1A, a substrate 100 is shown. The substrate 100 includes a substrate base 102, which base may be a monocrystalline semiconductor such as silicon according to certain embodiments. In the embodiment shown in FIG. 1A, a multilayer structure 108 is disposed on the substrate base 102, where the multilayer structure 108 may be formed of alternating layers of Si:Ge alloy and Si. The multilayer structure 108 may be formed in an epitaxial manner where the multilayer structure 108 maintains a monocrystalline nature, and forms a so-called heterostructure composed of different materials in the alternating layers. In some examples, the multilayer structure 108 may be used to form a Gate-all-around device, generally as known in the art. The substrate 100 further includes a top layer 110, which layer may be a silicon layer, also grown epitaxially upon the multilayer structure 108. As such, the substrate 100 in FIG. 1A may be a monocrystalline structure formed of the different layers, as shown. The substrate 100 further includes a cap layer 112, such as a silicon nitride layer.

Figure 1B:
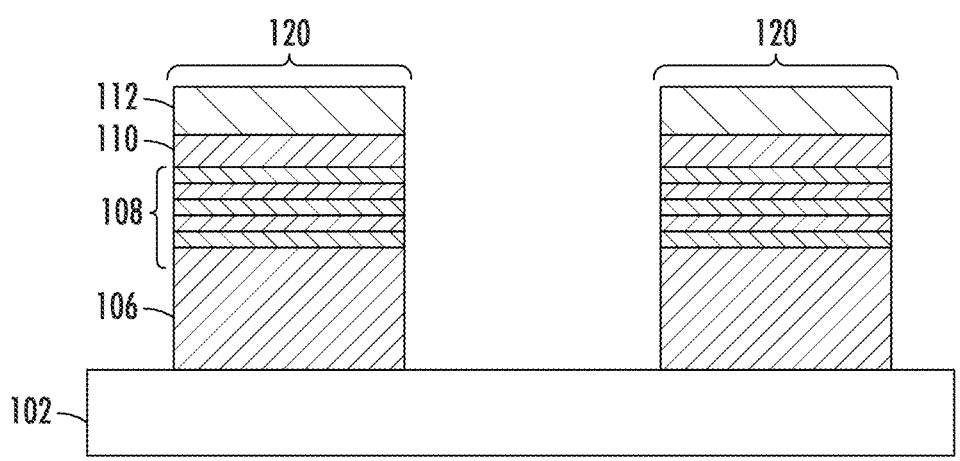

Turning to FIG. 1B, there is shown the substrate 100 after patterning to define separate surface features, shown as surface features 120. These surface features may be semiconductor fins, for example. The surface features 120 may be etched to the point that the surface features are etched below the multilayer structure 108, forming a layer 106 that is part of the surface features 120, but may constitute the same material as the substrate base 102. The surface features 120 may be used to form transistor devices in a gate-all-around type structure. For example, a given surface feature may be used to form transistor channels within the monocrystalline silicon of the multilayer structure 108. While just two surface features are shown, these surface features may represent multiple surface features that are arranged to form transistors of logic devices, memory devices, and so forth.

Figure 1C:
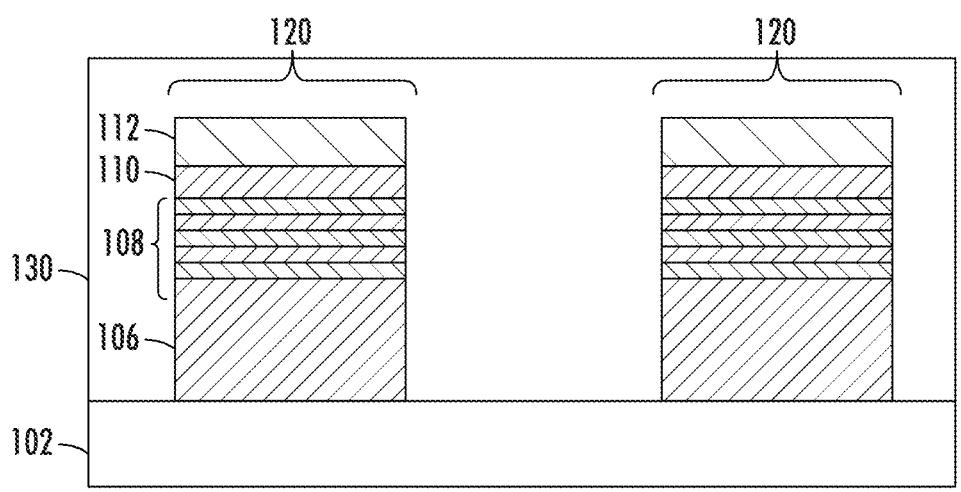

To isolate the surface features, an isolation layer 130 may be deposited over the surface features 120, as shown in FIG. 1C. The isolation layer may be a suitable insulator material such as silicon oxide. Flowable oxide material is one example of a suitable oxide material for isolation layer 130. For surface features having small dimensions, such as on the order of nanometers or tens of nanometers in the X and Z direction, and small pitches on the order of tens of nanometers of less, flowable oxide will provide suitable coverage to readily fill spaces between adjacent features.

Figure 1D:
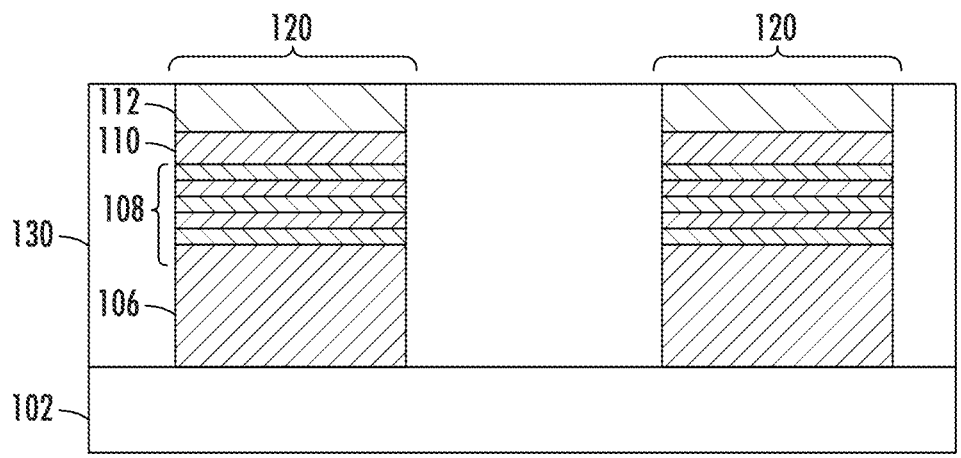

At FIG. 1D, there is shown a subsequent instance after the isolation layer 130 is planarized to the top of the cap layer 112.

Figure 1E:
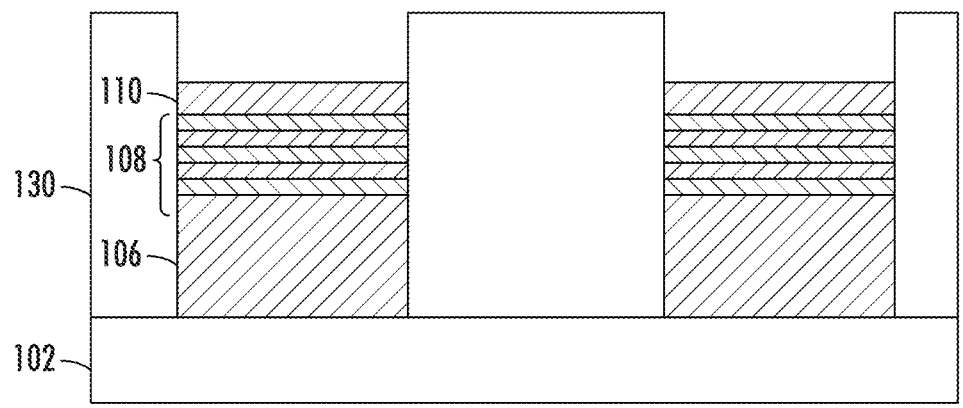

At FIG. 1E, the cap layer 112 is selectively removed, which process may be performed according to any suitable known method. At FIG. 1F, the isolation layer 130 is selectively etched to recess the top of the isolation layer 130, below the multilayer structure 108. The etching may be performed by any suitable etch process, such as an etch process that is selective to oxide and does not readily attack silicon or SiGe.

Subsequent to this stage of processing the substrate 100 as shown may be processed to form transistor devices, including doping processes, formation of source/drain regions, and formation of gate structures. For example, in a gate-all-around device, the SiGe layers of the multi-layer structure 108 may be selectively etched to reveal a series of isolated silicon structures (in this example, two isolated silicon structures), sometimes referred to as nanowires. Conductive gate material may subsequently be formed around these nanowires to form transistor gates, while source/drain regions, as well as sidewalls of the transistors are also formed. Such processing operations may entail multiple processing operations where the isolation layer 130 is subject to attack by the etchants, including, for example, dilute HF (DHF) etching.

Figure 1F:
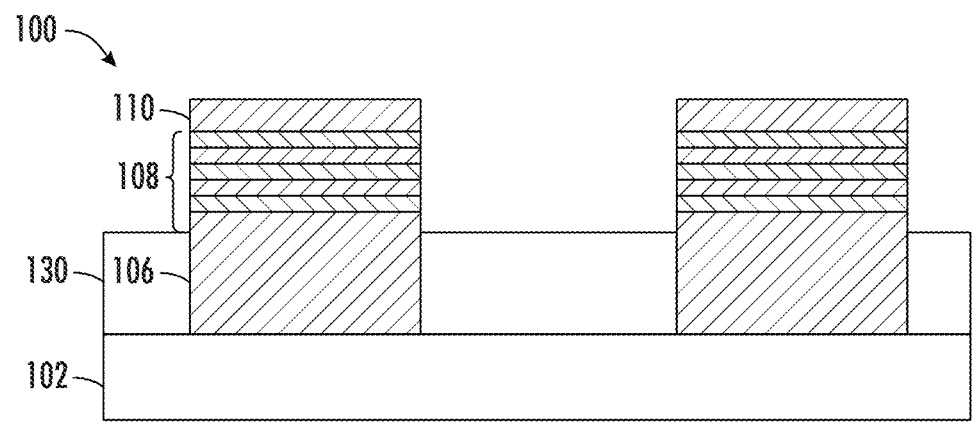

According to embodiments of the present disclosure, novel ion implantation processing may be performed to the device structure of FIG. 1F to protect the isolation layer 130 against attack from subsequent processing operations.

Figure 1G:
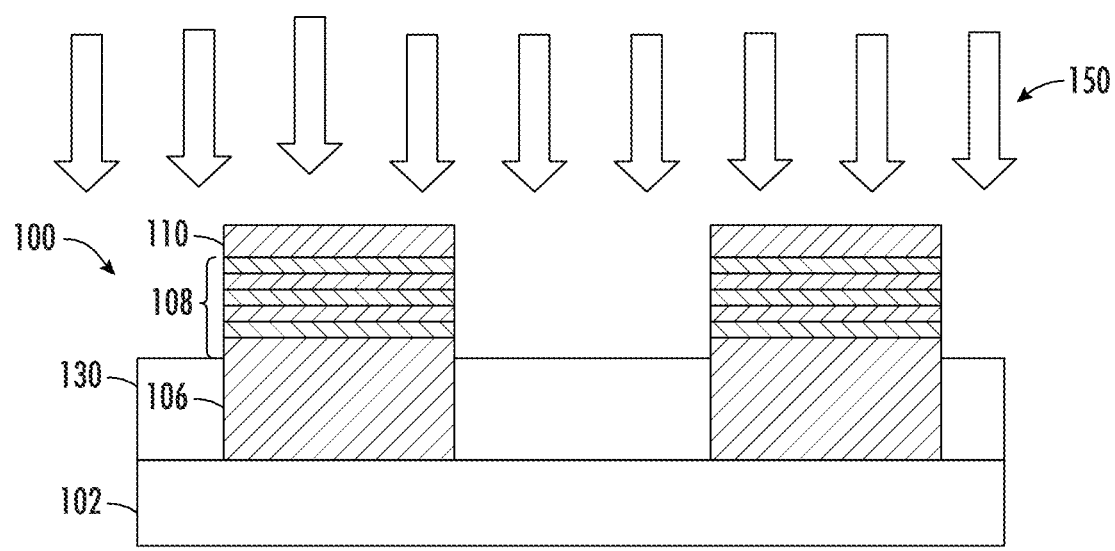

FIG. 1G depicts a subsequent instance where a low energy ion beam 150 is directed to the substrate 100. According to embodiments of the disclosure, the substrate 100 may be heated to a targeted temperature when the low energy ion beam 150 is directed to the substrate 100. Exemplary values of the targeted temperature may range between 400° C. and 700° C. in various non-limiting embodiments. Exemplary values of suitable ion energy for the low energy ion beam 150 may range between 100 eV and 500 eV in various non-limiting embodiments. Exemplary ion dose for the low energy ion beam 150 may range from 1E15 $cm^2$ to 1E16 $cm^2$ of ions. For oxides such as flowable oxide, silicon ions constitute a suitable ion for low energy ion beam 150.

Figure 1H:
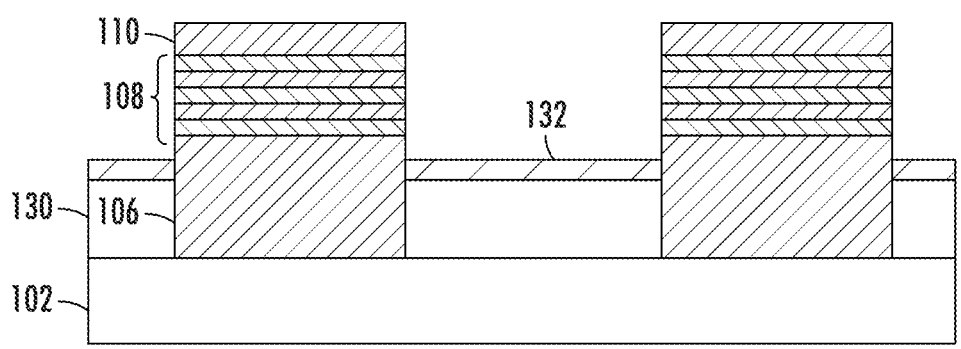

The exact ion energy and ion dose for low energy ion beam 150 may be chosen to implant a relatively shallow region of the isolation layer 130. As such, an altered layer 132 is formed within an outer portion of the isolation layer 130, while an inner portion of the isolation layer 130 is not implanted, as shown in FIG. 1H. In some embodiments, the thickness of the altered layer 132 may be 10 nm or less, may be 5 nm or less, while the overall thickness of the isolation layer 130 may be in the range of 10 nm to 100 nm in various non-limiting embodiments. As such, the altered layer 132 may form a small fraction of the thickness of the isolation layer 130.

Low energy implantation of the isolation layer 130, such as using silicon ions may have various benefits for subsequent processing of the device structure of FIG. 1H.

EXAMPLES

In some examples, low energy silicon ion implantation was performed into device structures formed with surface features that include an array of pillars or array of fins formed of a SiGe heterostructure, with flowable oxide disposed between the fins.

Starting Device Structure

Figure 2:
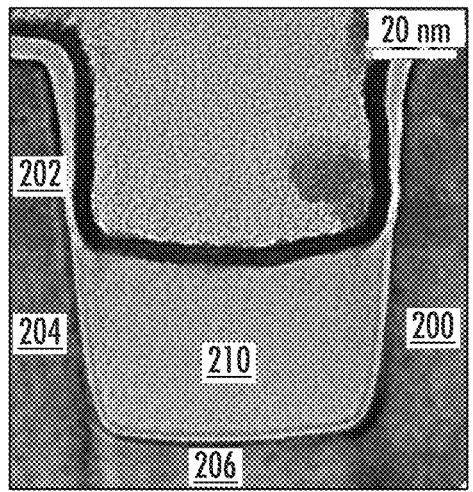
FIG. 2 depicts a side cross-sectional views of a substrate including a device structure, before etch processing.

FIG. 2 depicts a side cross-sectional views of a substrate including a device structure, before etch processing. The substrate is formed of ~100 nm tall and ~50 nm wide fins (shown as fins 200), including a SiGe heterostructure 202, toward the top of the fins, and a silicon layer 204 subjacent the SiGe heterostructure 202, where the silicon layer 204 of the fins 200 is formed monolithically from an underlying silicon base region 206. An isolation layer 210 made from flowable oxide and having a thickness of approximately 50 nm is formed between the fins 200.

Etch Effect on Starting Device Structure Processed Without Implantation

Figure 3:
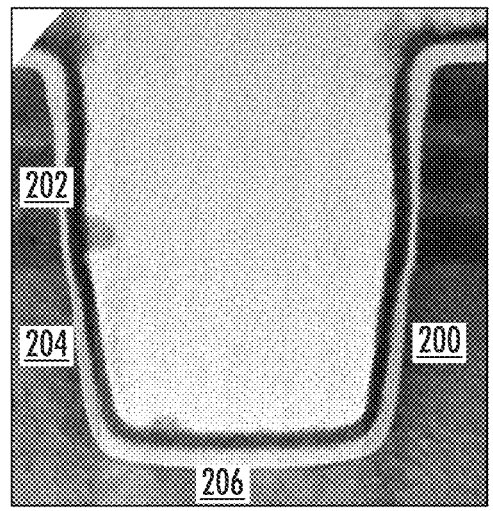
FIG. 3 depicts a side cross-sectional views of a substrate including the device structure of FIG. 2 after etch processing without prior implantation.

FIG. 3 depicts a side cross-sectional views of a substrate including the device structure of FIG. 2 after etch processing without prior implantation. In this example, the structure of FIG. 2 has been subject to etching in 2% DHF (dilute hydrofluoric acid) solution. The etching process is provided as a reference process, but is representative of etch conditions that may take place during processing of the device structure of FIG. 2 to form a gate-all-around device. As such, the entirety of the isolation layer 210 has been removed.

Figure 4A:
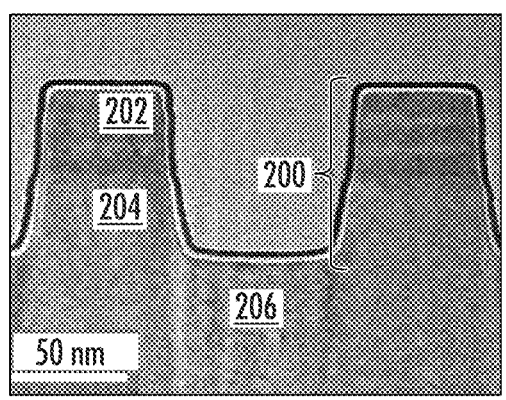
FIG. 4A depicts a side cross-sectional views of a substrate including the device structure of FIG. 2 after etch processing, when subject to elevated temperature without implantation prior to etch processing.

Etch Effect on Starting Device Structure After Processing at Elevated Temperature Without Proper Implantation FIG. 4A depicts a side cross-sectional views of a substrate including the device structure of FIG. 2 after etch processing with prior "dummy" implantation at elevated temperature. In particular, the sample was subject to a dummy implant, where the substrate (wafer) was loaded into an implant tool, clamped to the platen at the same process temperature for the same length of time as an implant, but was not implanted. Under these conditions, the isolation layer 210 is completely removed.

Figure 4B:
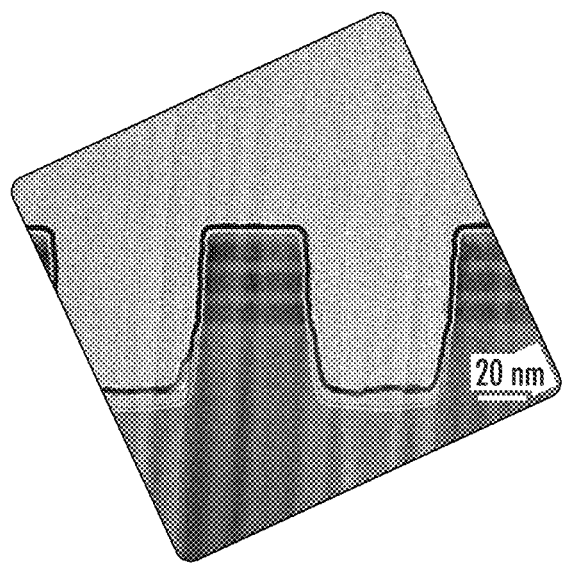
FIG. 4B depicts a side cross-sectional views of a substrate including the device structure of FIG. 2 after etch processing with prior implantation at room temperature.

Etch Effect on Starting Device Structure After Processing at Room Temperature With Implantation FIG. 4B depicts a side cross-sectional views of a substrate including the device structure of FIG. 2 after etch processing with implantation performed at room temperature, prior to etch processing. The implantation conditions are a 1.8 E15/cm$^2$ dose of silicon ions at an energy of 200 eV. Under these conditions, the isolation layer 210 is completely removed. Thus, the implantation under the conditions listed is ineffective in preventing subsequent etching of the isolation layer 210.

Figure 5A:
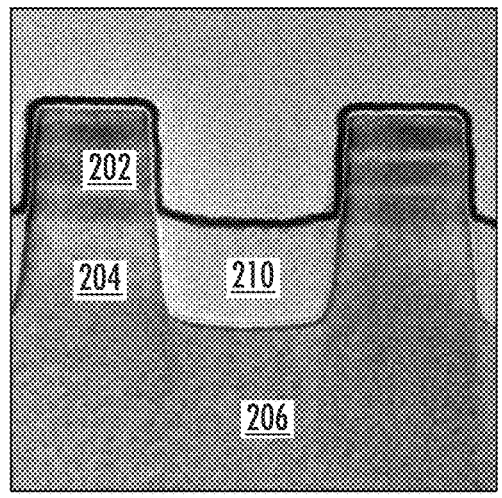
FIGS. 5A-5C depicts side cross-sectional views of a substrate including the device structure of FIG. 2 after etch processing with prior implantation at elevated temperature according to different embodiments of the disclosure.
Figure 5B:
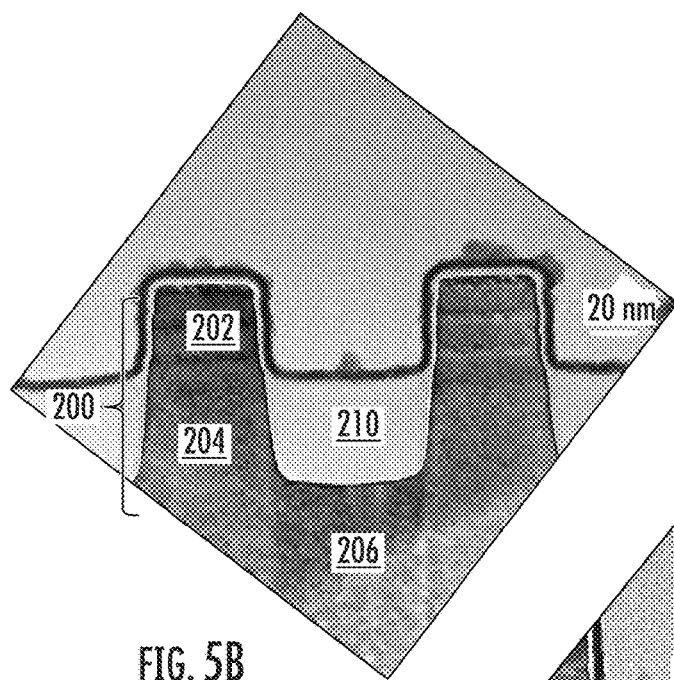
Figure 5C:
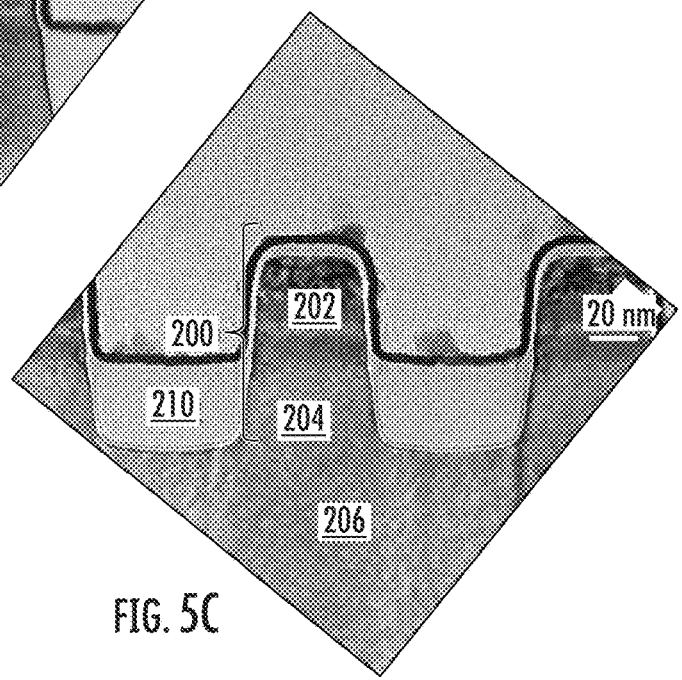

Etch Effect on Starting Device Structure After Processing at Elevated Temperature With Appropriate Implantation FIGS. 5A-5C depicts side cross-sectional views of a substrate including the device structure of FIG. 2 after etch processing with prior implantation at elevated temperature according to different embodiments of the disclosure. In each of these examples, the substrate is heated to 450° C. during implantation. In FIG. 5A, a dose of 1.85E15/cm$^2$ silicon ions is implanted at 200 eV into the isolation layer 210 before etching is performed. After etching, essentially the entirety of the isolation layer 210 remains.

In FIG. 5B, a dose of 3.3E15/cm$^2$ silicon ions is implanted at 500 eV into the isolation layer 210 before etching is performed. After etching, essentially the entirety of the isolation layer 210 remains.

In FIG. 5C, a dose of 3.3E15/cm$^2$ silicon ions is implanted at 500 eV into the isolation layer 210 before etching is performed. After etching, essentially the entirety of the isolation layer 210 remains.

Under all the conditions of FIGS. 5A-5C, the depth of an implanted or altered layer in the isolation layer 210 is believed to be much less than the thickness of the thickness of the isolation layer 210. Accordingly a majority of the isolation layer 210 is believed to be unimplanted in these examples. For instance, at 200 eV ion energy and 1.8 E15/cm$^2$ dose Si ions are believed to generate an altered layer in the isolation layer 210 to a depth of approximately 3 nm, based upon TRIM (transport of ions in matter) calculations.

Without limitation as to any particular theory, the combination of heating a substrate and providing low energy implantation using suitable ions such as silicon, within a near-surface region of an oxide layer, such as flowable oxide, is believed to physically and/or chemically alter the near-surface region of the oxide layer in a manner that drastically reduces the etch rate of the oxide layer.

Unexpectedly, the present inventors have found that the most suitable ion energy range for performing implantation that effectively reduces the etch rate of an oxide layer is relatively low, in the range where implantation depth is less than 5 nm. This discovery opens up the possibility of processing semiconductor devices that are especially sensitive to implant damage, since implant damage will generally be lessened with lower ion energy.

While the use of high energy ion implantation may also be effective in reducing etch rate of an implanted oxide, such high energy may not be suitable for optimal device processing. For example, known approaches for densification of oxide in silicon-based devices may employ 20 keV implantation of helium. At such high energies the silicon-based devices will need to be resistant to implant damage, since 20 keV helium ions may cause extensive damage to the crystalline lattice of silicon.

For example, in the present results (see FIG. 5C) illustrate significant visible damage at the top of fins 200, likely induced by the 3 keV Si ion bombardment. Much less damage is visible in the sample implanted at 500 eV (FIG. 5B), while no lattice damage is visible for 200 eV implantation (FIG. 5A). While subsequent thermal treatment such as annealing may reduce or remove the damage induced by 3 keV implantation, such thermal treatment may induce unacceptable levels of interdiffusion of germanium and silicon within the SiGe heterostructure 202. Such interdiffusion may reduce the difference in chemical composition between nominal silicon layers and nominal SiGe layers in the heterostructure, and may thus preclude the ability to selectively remove the altered SiGe layers in order to form isolated silicon nanowires. In view of the above, for applications for forming gate-all-around structures based upon SiGe/Si heterostructures, an effective upper range of ion energy for silicon implantation into an isolation layer is thought to be in the range of 1000 eV or so.

Note also that while the present results demonstrate wherein room temperature low energy ion implantation is not effective in providing etch resistance to a flowable oxide material, increasing substrate temperature to 500° C., 600° C. or 700° C. during low energy implantation should be effective in providing etch resistance. However, increasing substrate temperature beyond 700° C. for the duration needed to implant a dose of ions may cause unwanted diffusion during the implantation process, again reducing the ability to subsequently form GAA structures based upon SiGe/Si heterostructures. Therefore, the present approach may be limited to implantation into an insulator layer, such as a flowable oxide layer at a substrate temperature above room temperature and ranging up to 700° C. As for the lower limit of temperature where the present embodiments may be effective, it is believed the ion implantation process breaks the chemical bonding between silicon atoms and hydrogen incorporated in oxide films such as flowable oxide. For room temperature implantation, the this bond breaking does not result in substantial removal of hydrogen in the oxide film, so the hydrogen can re-bond with the silicon in the oxide layer. However, at higher temperatures, the hydrogen is able to permanently diffuse from and escape from the oxide film (that is, the region of the altered layer). The absence of this hydrogen in the altered layer of the oxide film may accordingly lead to the observed changes in the etch properties of the film. Accordingly, while the present results show the use of temperatures of 400° C. or so are very effective in creating an etch resistance altered layer, it can be reasonably expected substrate temperatures as low as 250° C. or 300° C. will also create a hydrogen-depleted altered layer that is etch resistant when subject to the low energy implantation conditions as described hereinabove.

In embodiments where device fin structures are formed of silicon, such as in known finFET devices, without the presence of SiGe heterostructures, post-implantation thermal treatment may be appropriate to recover implant damage, even at energies as high as 3 keV, since interdiffusion of silicon and germanium is not a concern. Thus, for applications for finFET devices based upon silicon, an effective upper range of ion energy for silicon implantation into an isolation layer is thought to be in the range of 3000 eV or so.

While the aforementioned embodiments have focused on the use of silicon ion implantation, implantation using low energy Ge ions is thought to also be effective in reducing etch rate of flowable oxide. The ion energy range and dose for implantation of Ge will scale somewhat because of the different mass of Ge as opposed to silicon, but such values of ion energy and ion dose will be limited to a range for producing a thin altered layer within the top region of the flowable oxide, such as 1 nm to 5 nm in thickness.

Figure 6:
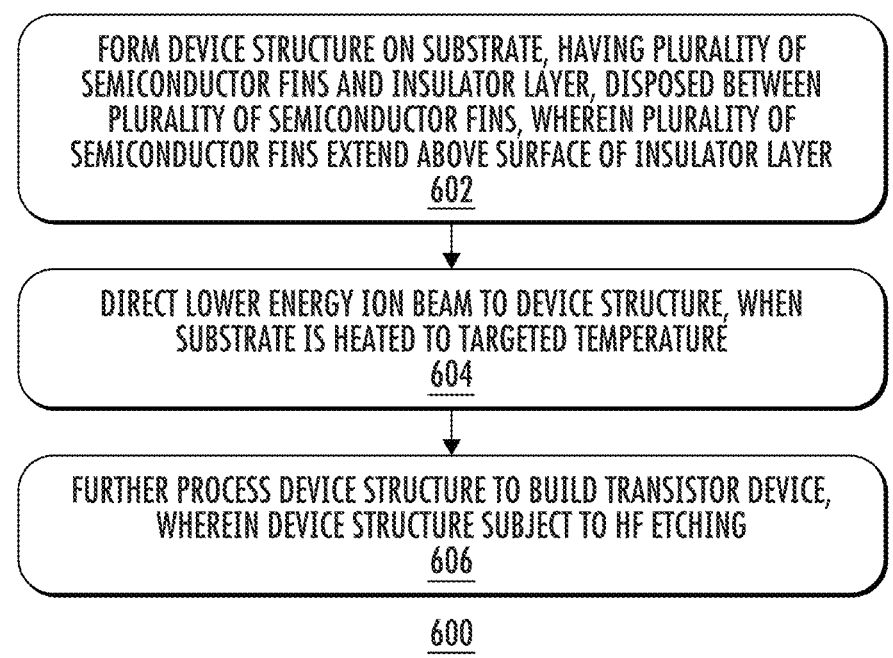
FIG. 6 depicts a process flow, according to embodiments of the disclosure.

FIG. 6 depicts an exemplary process flow 600. At block 602, a device structure is formed on a substrate, having a plurality of semiconductor fins and an insulator layer, disposed between the plurality of semiconductor fins, where the plurality of semiconductor fins extend above the surface of the insulator layer. According to various non-limiting embodiments of the disclosure, the insulator layer may be formed of a flowable oxide that tends to have a relatively high etch rate in etchants such as DHF. According to various non-limiting embodiments of the disclosure, the semiconductor fins may be formed of silicon or a combination of silicon and a SiGe heterostructure.

At block 604 a low energy ion beam is directed to the device structure when the substrate is heated to a targeted temperature. The targeted temperature may be between 400° C. and 700° C. in various non-limiting embodiments. The low energy ion beam may be composed of silicon ions in particular embodiments, or of germanium ions in other embodiments. The low energy ion beam may be directed to the device structure at an ion energy in the range of 100 eV to 1000 eV in some non-limiting embodiments. Exemplary ion dose for the low energy ion beam may scale with exact ion energy, but may vary between 1E15 cm$^2$ to 1E16 cm$^2$ in some non-limiting embodiments.

At block 606, the device structure is further processed to build a transistor device(s) including the plurality of semiconductor fins. As such, the further processing may include subjecting the device structure to HF etching, where the implanted insulator layer provides adequate etch resistance to the HF etching.

In summary, the present inventors have discovered a low ion energy/high substrate temperature approach to implant device structures to greatly enhance etch resistance of oxide layers, such as flowable oxide, when subject to etchants such as HF, without undue device damage.

The present embodiments provide various advantages over known approaches to improve isolation layers in devices such as GAA devices and finFET devices. For example, the present embodiments provide a first advantage by avoiding undue implant damage to semiconductor fins, where the implant damage may occur using known helium implants to densify oxide layer. The present embodiments, employing low energy silicon as an implant species, may also avoid the need for a dedicated tool to perform implantation into a device, such as required for He implantation. The present embodiments provide a further advantage by enabling practical processing of ultrascaled GAA devices where low density oxides are needed to provide gap fill between semiconductor fins. Such low density oxides benefit from implant densification to resist subsequent etching, without damage to the SiGe heterostructure at the same time. By providing a very low energy implantation approach, post-implantation annealing that may unduly diffuse the SiGe heterostructure can be avoided.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
providing a substrate, the substrate comprising a plurality of surface features, an isolation layer, disposed between the plurality of surface features, and a substrate base, disposed subjacent the isolation layer and the plurality of surface features, wherein the plurality of surface features extend above a surface of the isolation layer; and
directing a low energy ion beam to the substrate, when the substrate is heated at a targeted temperature, wherein an altered layer is formed within an outer portion of the isolation layer, and wherein an inner portion of the isolation layer is not implanted;
wherein an energy of the low energy ion beam is in a range of 100 eV to 500 eV.

2. The method of claim 1, wherein the isolation layer comprises a flowable oxide.

3. The method of claim 1, wherein the plurality of surface features comprise an array of semiconductor fins.

4. The method of claim 3, wherein the array of semiconductor fins comprise a Si/SiGe heterostructure.

5. The method of claim 1, wherein the altered layer comprises a thickness of 5 urn less.

6. The method of claim 1, wherein the low energy ion beam comprises silicon ions.

7. The method of claim 6, wherein the low energy ion beam implants a dose of 1E15 cm$^2$ to 1E16 cm$^2$ of silicon ions.

8. The method of claim 1, further comprising processing the substrate to generate a plurality of transistor devices using the plurality of surface features, after the directing the low energy ion beam.

9. The method of claim 1, wherein the targeted temperature is 400° C. to 700° C.

10. A method of forming a fin-type device comprising:
providing a substrate, the substrate comprising:
a plurality of semiconductor fins;
an isolation layer, comprising a flowable oxide disposed between the plurality of semiconductor fins;
and a substrate base, disposed subjacent the isolation layer and the plurality of semiconductor fins, wherein the plurality of semiconductor fins extend above a surface of the isolation layer; and
directing a low energy silicon ion beam to the substrate, when the substrate as heated at a targeted temperature, wherein the low energy comprises an ion energy in a range of 100 eV to 500 eV.

11. The method of claim 10, wherein the low energy silicon ion beam implants a dose of 1E15 $cm^2$ to 3.3E15 $cm^2$ of silicon ions.

12. The method of claim 10, further comprising processing the substrate to generate a plurality of transistor devices on the plurality of semiconductor fins, after the directing the low energy silicon ion beam, wherein the directing the low energy silicon ion beam causes a reduction in etch rate of the flowable oxide.

13. The method of claim 10, wherein the targeted temperature is 400° C. to 700° C.

14. A method of forming a gate all around (GA) device, comprising:
providing a substrate, the substrate comprising a plurality of semiconductor fins, an isolation layer, disposed between the plurality of semiconductor fins, and a substrate base, disposed subjacent the isolation layer and the plurality of semiconductor fins, wherein the plurality of semiconductor fins comprise a Si/SiGe heterostructure and extend above a surface of the isolation layer; and
directing a low energy silicon ion beam to the substrate, when the substrate as heated at a temperature in a range of 400° C. to 700° C., wherein the low energy comprises an ion energy in a range of 100 eV to 500 eV.

15. The method of claim 14, wherein the isolation layer comprises a flowable oxide.

16. The method of claim 14, wherein an altered layer is formed within an outer portion of the isolation layer, and wherein an inner portion of the isolation layer is not implanted, wherein the altered layer comprises a thickness of 5 nm or less.

17. The method of claim 14, wherein the low energy silicon ion beam comprises an implant dose of 1E15 $cm^2$ to 1E16 $cm^2$ of silicon ions.

18. The method of claim 17, wherein the implant dose is between 1E15 $cm^2$ to 3.3E15 $cm^2$.

19. The method of claim 14, wherein the ion energy is 200 eV.

* * * * *